(12) United States Patent
Rajarajan et al.

(10) Patent No.: US 11,514,985 B2
(45) Date of Patent: Nov. 29, 2022

(54) SPIKE CURRENT SUPPRESSION IN A MEMORY ARRAY

(71) Applicant: Micron Technology, Inc., Boise, ID (US)

(72) Inventors: Sundaravadivel Rajarajan, South Jordan, UT (US); Srivatsan Venkatesan, Sandy, UT (US); Iniyan Soundappa Elango, Lehi, UT (US); Robert Douglas Cassel, Lehi, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/222,864

(22) Filed: Apr. 5, 2021

(65) Prior Publication Data
US 2022/0319592 A1 Oct. 6, 2022

(51) Int. Cl.
*G11C 13/00* (2006.01)
*H01L 27/24* (2006.01)
(Continued)

(52) U.S. Cl.
CPC .......... *G11C 13/003* (2013.01); *G06F 3/0616* (2013.01); *G06F 3/0659* (2013.01); *G06F 3/0673* (2013.01); *G11C 13/0004* (2013.01); *G11C 13/0026* (2013.01); *G11C 13/0028* (2013.01); *H01L 27/2463* (2013.01); *H01L 45/06* (2013.01); *H01L 45/1233* (2013.01);
(Continued)

(58) Field of Classification Search
CPC ..... H01L 45/08; H01L 27/2463; H01L 45/06; H01L 45/141; H01L 45/1233; H01L 45/142; H01L 45/143; H01L 45/144; H01L 45/148; H01L 45/1226; H01L 45/14; H01L 27/2427; H01L 45/1675; G11C 13/0004; G11C 13/003; G11C 13/0023; G11C 13/004; G11C 13/0059; G11C 13/0069; G11C 2213/30; G11C 2213/71; G11C 13/0002; G11C 13/0007; G11C 7/04; G11C 7/24; G11C 2213/72
USPC ............................................ 365/230.03, 148
See application file for complete search history.

(56) References Cited

U.S. PATENT DOCUMENTS 10,431,301 B2 10/2019 Mirichigni et al.
10,566,052 B2 2/2020 Mirichigni et al.
(Continued)

OTHER PUBLICATIONS

International Search Report and Written Opinion, PCT/US2022/021420, dated Jul. 11, 2022.
(Continued)

*Primary Examiner* — Thong Q Le
(74) *Attorney, Agent, or Firm* — Greenberg Traurig

(57) ABSTRACT

Systems, methods, and apparatus related to spike current suppression in a memory array. In one approach, a memory device includes a memory array having a cross-point memory architecture. The memory array has access lines (e.g., word lines and/or bit lines) configured to access memory cells of the memory array. Each access line is split into left and right portions. Each portion is electrically connected to a single via, which a driver uses to generate a voltage on the access line. To reduce electrical discharge associated with current spikes, a first resistor is located between the left portion and the via, and a second resistor is located between the right portion and the via.

20 Claims, 13 Drawing Sheets

(51) Int. Cl.
  *H01L 45/00* (2006.01)
  *G06F 3/06* (2006.01)
(52) U.S. Cl.
  CPC ........ *H01L 45/141* (2013.01); *H01L 45/1641*
  (2013.01)

(56) References Cited

U.S. PATENT DOCUMENTS

| | | |
|---|---|---|
| 11,100,986 B2 | 8/2021 | Wang |
| 2004/0130000 A1 | 7/2004 | Pellizzer et al. |
| 2009/0073760 A1 | 3/2009 | Betser et al. |
| 2010/0096628 A1 | 4/2010 | Song et al. |
| 2011/0024712 A1 | 2/2011 | Chen et al. |
| 2012/0145986 A1 | 6/2012 | Yasutake |
| 2013/0094279 A1 | 4/2013 | Kobatake |
| 2016/0071553 A1* | 3/2016 | Irizarry .............. G11C 13/0026 365/189.011 |
| 2016/0233224 A1 | 8/2016 | Rhie |
| 2016/0247565 A1 | 8/2016 | Pemer et al. |
| 2017/0092748 A1 | 3/2017 | Ting et al. |
| 2018/0301412 A1 | 10/2018 | Borsari |
| 2019/0043807 A1 | 2/2019 | Redaelli et al. |
| 2020/0082885 A1 | 3/2020 | Lin et al. |
| 2020/0321519 A1 | 10/2020 | Yim et al. |
| 2020/0357761 A1 | 11/2020 | Moore et al. |
| 2020/0365658 A1 | 11/2020 | Takahashi et al. |

OTHER PUBLICATIONS

International Search Report and Written Opinion, PCT/US2022/021416, dated Jul. 8, 2022.

* cited by examiner

SPIKE CURRENT SUPPRESSION IN A MEMORY ARRAY

FIELD OF THE TECHNOLOGY

At least some embodiments disclosed herein relate to memory devices in general, and more particularly, but not limited to spike current suppression in a memory array.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory devices (e.g., FeRAM) may maintain their stored logic state for extended periods of time even in the absence of an external power source. Volatile memory devices (e.g., DRAM) may lose their stored state when disconnected from an external power source.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
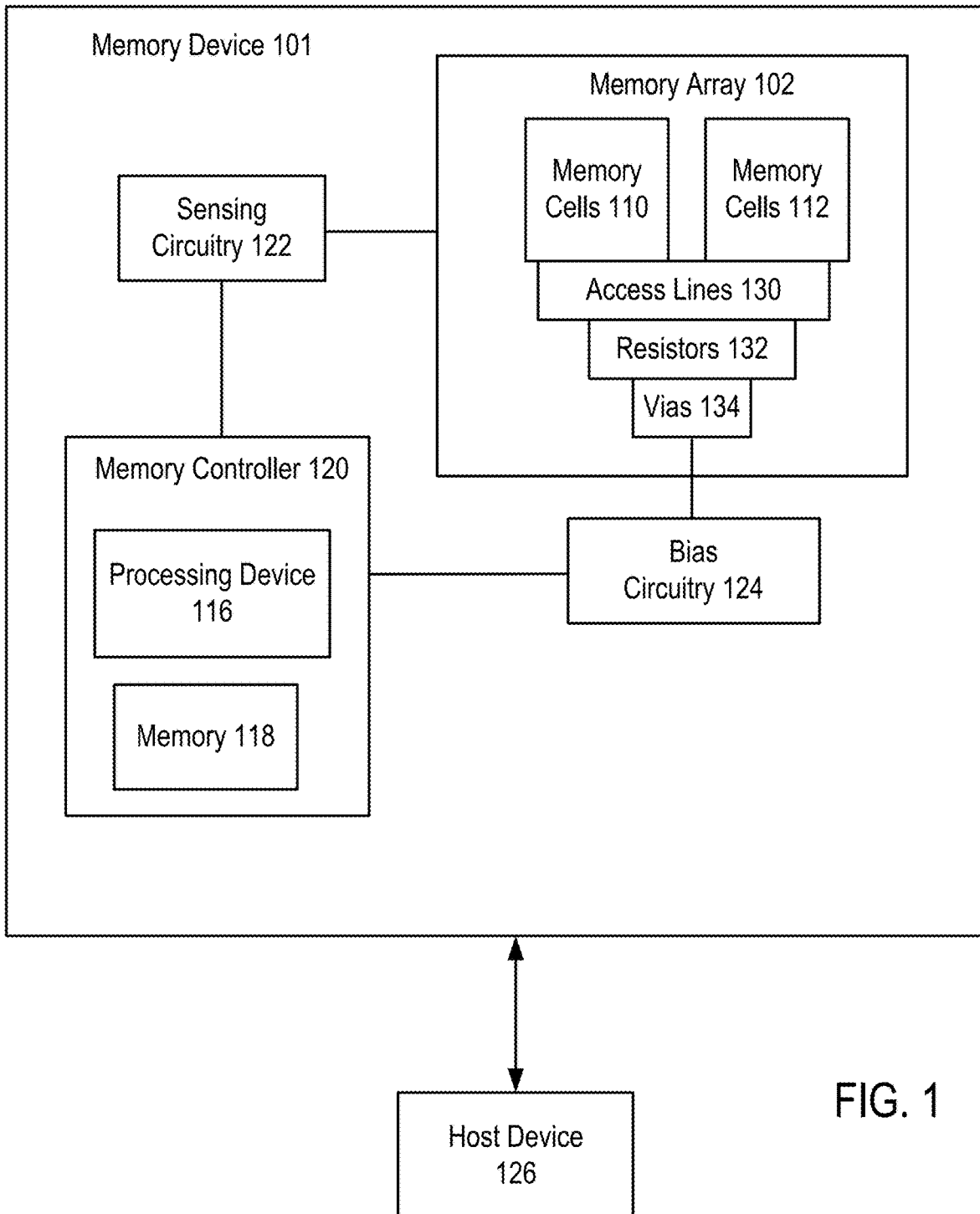
FIG. 1 shows a memory device that implements spike current suppression in a memory array, in accordance with some embodiments.

The following disclosure describes various embodiments for spike current suppression in a memory array. At least some embodiments herein relate to a memory device having a memory array that uses a cross-point architecture. In one example, the memory array is a resistive RAM (RRAM) cross-point memory array, or a ferroelectric RAM (FeRAM) cross-point memory array. Other memory types may be used.

In one example, the memory device stores data used by a host device (e.g., a computing device of an autonomous vehicle, an artificial intelligence (AI) engine, or other computing device that accesses data stored in the memory device). In one example, the memory device is a solid-state drive mounted in an electric vehicle.

In some memory arrays (e.g., a cross-point memory array), current discharges through a memory cell may result in current spikes (e.g., relatively high current discharge through the memory cell in a relatively short time period), which may cause damage to the memory cell. For example, current discharge that occurs when a chalcogenide memory cell snaps can result in amorphization of the memory cell. Such spikes may result from internal discharge within the memory array. In one example, this is the discharge of parasitic capacitances within the memory array. Current spikes due to internal discharge may be particularly problematic.

In one example, memory cells are selected by generating voltages on word and bit lines of the memory array. When the memory cell is selected, a large current spike can flow through the cell. The spike is caused by parasitic capacitances that have accumulated charge during operation of the memory device. The charge is discharged as a current spike that can cause damage to the memory cell.

In one example, the memory cell is a chalcogenide-based self-selecting memory cell that snaps when selected (e.g., the cell is in a SET state). A selection spike results from discharge of parasitic capacitances coupled to the word and/or bit line that are used to select the memory cell. Memory cells that use both a select device and a memory storage element (e.g., phase change memory) can suffer from similar problems.

This selection spike can be a root cause of several reliability mechanisms. This is particularly true for memory cells that are located near a decoder, for which spike current is typically greater. For example, the selection spikes cause reliability mechanisms such as read disturb and/or endurance degradation.

In one example, various voltages of a memory array may be altered to perform access operations. The various voltage alterations may cause charge in the memory array to build up, for example, in the parasitic capacitances associated with the array (e.g., the parasitic capacitances of the access lines of the memory array). In some cases, the built-up charge may discharge through a selected memory cell. For example, a memory cell may become conductive based on being selected (e.g., when accessed, such as when a voltage across the memory cell crosses a threshold voltage of the memory cell), which may allow built-up charge on the access lines coupled with the memory cell to discharge through the cell in a current spike (e.g., a current spike having a peak magnitude of at least 100 microamps, such as 200-300 microamps). The memory cell may be degraded or worn out in proportion to the number and magnitude of current spikes experienced by the memory cell over time.

In one example, a memory array uses self-selecting chalcogenide memory cells. As cells are selected, word and bit lines are charged up to select the cells. This can cause capacitive coupling to adjacent word or bit lines for adjacent cells. Over time, this capacitive coupling causes electrical charge to accumulate in various parasitic capacitances (e.g., such as mentioned above). When the memory cell is selected and snaps (e.g., during a read operation), the accumulated electrical charge flows through the memory cell as a current spike.

In some cases, current spikes may be higher for memory cells located close or near to a via that connects to an access line driver (e.g., a near electrical distance (ED)) than for memory cells located far from the via/driver (e.g., a far ED). For example, discharge through a memory cell with a near ED may be more severe due to a relatively lower resistance path between the memory cell and the charge built up in parasitic capacitances along the entire length of the access line, which may result in a higher amount of current through the memory cell when the memory cell becomes conductive (e.g., a relatively higher magnitude current spike) than for memory cells with far ED, which may be more separated from charge built up along farther away portions of the access line (e.g., charge built up far along the access line on the other side of the via).

To address these and other technical problems, one or more resistors are used to screen electrical discharge from portions of an access line other than the portion being used to access a memory cell. The screening of the electrical discharge by the one or more resistors reduces the extent of electrical discharge that would occur in the absence of the resistors (e.g., the lack of such resistors in prior devices).

The physical configuration of the resistors can be customized depending, for example, on the location of the access line in a memory array. In one example, each resistor is a portion of a resistive film located between the access line and a via that is electrically connected to a driver used to drive voltages on the access line when selecting the memory cell.

In one example, the access line is a word line of a cross-point memory array. The one or more resistors are configured to increase the resistance of a circuit path through which parasitic capacitance(s) of the cross-point memory array may discharge so that the magnitude of any current spike is reduced. The magnitude of the current spike is lower as compared to prior approaches in which the resistors are not used (e.g., the resistors increase the resistance of the RC discharge circuit, which reduces the current spike). Also, the use of the one or more resistors has minimal impact on the ability to bias and deliver current to the word line for normal memory cell operations such as reading, writing, etc.

In one embodiment, an access line is split into left and right portions (e.g., left and right word line or bit line portions). Each portion is electrically connected to a via, which a driver uses to generate a voltage on the access line. To reduce electrical discharge associated with current spikes, a first resistor is located between the left portion and the via, and a second resistor is located between the right portion and the via.

In one embodiment, a memory device includes a memory array having a cross-point memory architecture. The memory array has an access line configured to access memory cells of the memory array. The access line has a first portion and a second portion on opposite sides of a central region of the access line. The first portion is configured to access a first memory cell, and the second portion configured to access a second memory cell. In one example, the access line is a word line or bit line, and the central region is in the middle of the word or bit line. In one example, the access line is split into left and right portions as mentioned above.

One or more vias are electrically connected at the central region to the first portion and the second portion. In one example, a single via is used. In other examples, multiple vias can be used.

A first resistor is located between the first portion of the access line and the via. The first resistor is configured so as to screen electrical discharge from the first portion when accessing the second memory cell. A second resistor is located between the second portion and the via. The second resistor is configured to screen electrical discharge from the second portion when accessing the first memory cell.

A driver is electrically connected to the one or more vias. The driver is configured to generate a voltage on the first portion when accessing the first memory cell. The driver generates a voltage on the second portion when accessing the second memory cell. In one example, the driver is a word line or bit line driver. In one example, the driver is electrically connected to a single via in the middle of a word line, and a voltage is generated on both the first and second portions when accessing a single memory cell. The memory cell can be located on either the first or second portion.

Various advantages are provided by embodiments described herein. In one advantage, current spikes that result during selection of a memory cell are suppressed by screening charge from far capacitances in a memory array (e.g., charge from far cells on a left portion of an access line in a left half tile used to access a near memory cell, and/or charge from a right portion of the access line in the right half tile). In one advantage, the resistors above can readily be added on an existing quilt architecture.

In one advantage, use of the resistors above can be varied for different locations of the memory array. The layers used to form the memory cell stack can be the same for all portions of the memory array. Thus, the use of the spike current suppression as described herein can be transparent to memory cell structure.

In one advantage, for a given level of tolerable current spike, tile size and thus memory density can be increased. In one advantage, various different resistor configurations can be combined and varied as desired for different portions of a memory array. In one advantage, the spike current suppression can be generally used for any cross-point technology.

FIG. 1 shows a memory device 101 that implements spike current suppression in a memory array 102 of memory device 101, in accordance with some embodiments. Memory device 101 includes memory controller 120, which controls sensing circuitry 122 and bias circuitry 124. Memory controller 120 includes processing device 116 and memory 118. In one example, memory 118 stores firmware that executes on processing device 116 to perform various operations for memory device 101. In one example, the operations include reading and writing to various memory cells of memory array 102.

The memory cells of memory array 102 include memory cells 110 and memory cells 112. In one example, memory cells 110 are located in a left half tile and memory cells 112 are located in a right half tile of the memory array.

Access lines 130 of memory array 102 are used to access memory cells 110, 112. In one example, access lines 130 are word lines and/or bit lines. In one example, each access line 130 is split in a central region (e.g., the middle of the access line) to have a left portion that accesses memory cells 110 and a right portion that accesses memory cells 112.

Bias circuitry 124 is used to generate voltages on access lines 130. Vias 134 are used to electrically connect access lines 130 to bias circuitry 124. In one example, a single via 134 is used to electrically connect a left portion and a right portion of each access line 130 to a word or bit line driver of bias circuitry 124.

In one example, a voltage is driven on a left portion of an access line 130 to access a memory cell 110. In one example, the voltage is driven as part of a read or write operation performed in response to a command received from host device 126.

Sensing circuitry 122 is used to sense current flowing through memory cells 110, 112. In one example, sensing circuitry 122 senses a current that results from applying a voltage to a memory cell 110 during a read operation.

In one embodiment, in order to suppress spike currents in memory array 102, various resistors 132 are located between access lines 130 and vias 134. The resistors 132 screen electrical discharge (e.g., as described above) from certain portions of access lines 130 that can occur when a memory cell 110, 112 is accessed (e.g., when a chalcogenide memory cell snaps).

In one embodiment, memory device 101 selects write voltages for applying to memory cells 110, 112 when performing write operations. In one embodiment, bias circuitry 124 is implemented by one or more voltage drivers. Bias circuitry 124 may further be used to generate read voltages for read operations performed on memory array 102 (e.g., in response to a read command from host device 126).

In one embodiment, sensing circuitry 122 is used to sense a state of each memory cell in memory array 102. In one example, sensing circuitry 122 includes current sensors (e.g., sense amplifiers) used to detect a current caused by applying various read voltages to memory cells in memory array 102. Sensing circuitry 122 senses a current associated with each of the memory cells 110 caused by applying the voltage.

In one example, if sensing circuitry 122 determines that the respective current resulting from applying a read voltage to the memory cell is greater than a respective fixed threshold (e.g., a predetermined level of current or threshold current), then memory controller 120 determines that the memory cell has snapped.

In one embodiment, memory cells 110, 112 can be of different memory types (e.g., single level cell, or triple level cell).

In one embodiment, memory controller 120 receives a write command from a host device 126. The write command is accompanied by data (e.g., user data of a user of host device 126) to be written to memory array 102. In response to receiving the write command, controller 120 initiates a programming operation by applying voltages to memory cells 110. Controller 120 determines respective currents resulting from applying the voltages.

In one embodiment, controller 120 determines whether the existing programming state (e.g., logic state zero) and the target programming state (e.g., logic state zero) for each cell are equal. If the existing and target programming states are equal, then no write voltage is applied (e.g., this is a normal write mode). If the existing and target programming states are different, then a write voltage is applied to that particular memory cell. In one example, the write voltage is 3-8 volts applied across the memory cell by applying voltage biases to the word line and bit line used to select the cell.

In one example, controller 120 may use write voltages (e.g., write pulses) to write a logic state to a memory cell, such as memory cell 110, 112 during the write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

Figure 2:
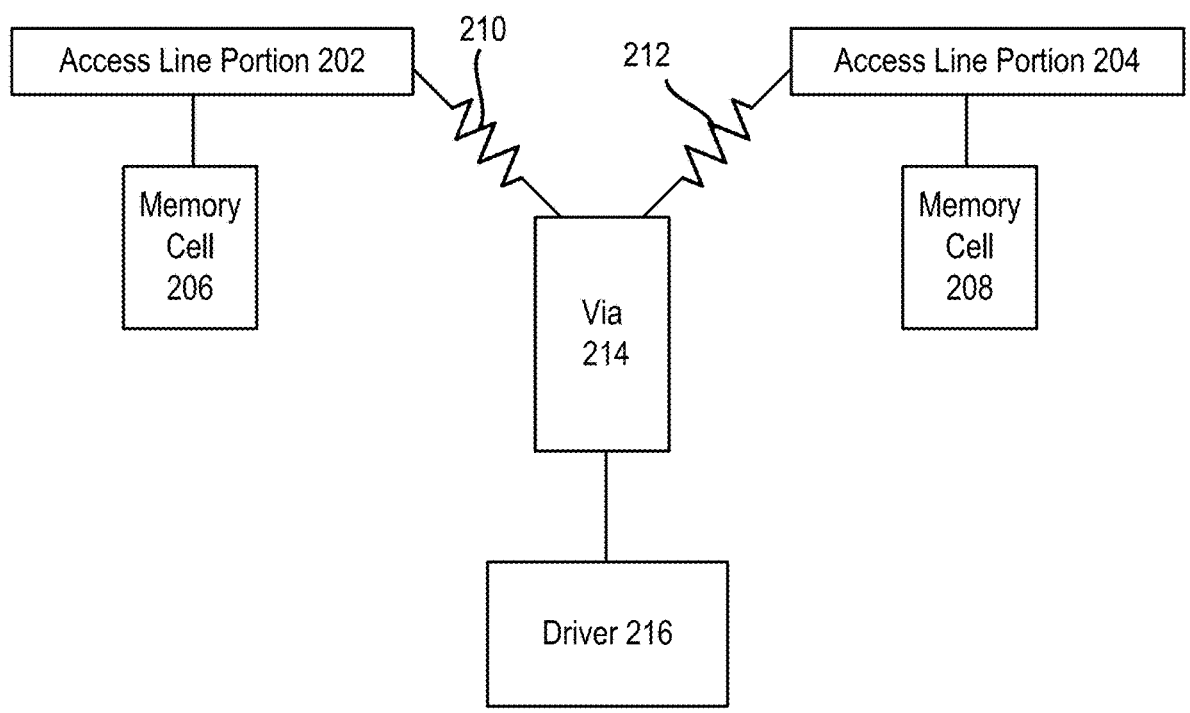
FIG. 2 shows resistors used to implement spike current suppression for an access line of a memory array, in accordance with some embodiments.

FIG. 2 shows resistors 210, 212 used to implement spike current suppression for an access line of a memory array, in accordance with some embodiments. The access line has a first portion 202 and a second portion 204 (e.g., left and right portions as described above). The access line of FIG. 2 is an example of an access line 130 of memory array 102. Portion 202 is used to access memory cell 206, and portion 204 is used to access memory cell 208. Each portion 202, 204 is typically used to access multiple memory cells (e.g., memory cells located in the memory array above and below the respective portion).

Access line portions 202, 204 are electrically connected to via 214 by resistors 210, 212. In one example, access line portions 202, 204 are portions of a conductive layer in a memory array. In one example, resistors 210, 212 are portions of a resistive film formed underlying the conductive layer and overlying via 214.

In one example, via 214 is a single via. In one example, via 214 is provided by multiple vias. Via 214 electrically connects driver 216 to access line portions 202, 204. Driver 216 is an example of bias circuitry 124. In one example, driver 216 generates a read voltage on portion 202 in order to determine a state of memory cell 206. In one example, driver 216 generates a read voltage on portion 204 in order to determine a state of memory cell 208.

Memory cells 206, 208 may be formed using various memory cell types. In one example, the memory cell includes chalcogenide. In one example, the memory cell includes a select device, and a phase change material as a memory element. In one example, the memory cell is a self-selecting memory cell including chalcogenide. In one example, the memory cell is a resistive memory cell.

Figure 3:
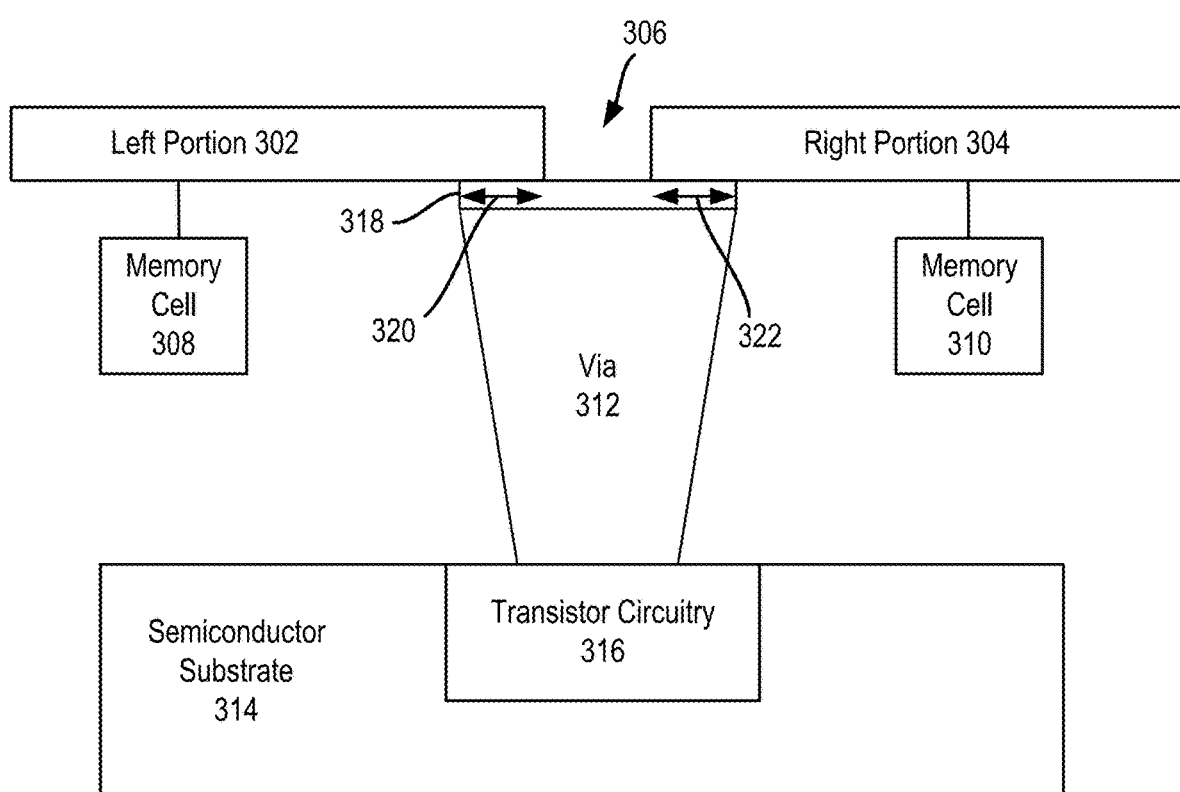
FIG. 3 shows an access line split into left and right portions for spike current suppression, in accordance with some embodiments.

FIG. 3 shows an access line split into left and right portions 302, 304 for spike current suppression, in accordance with some embodiments. Left portion 302 is used to access memory cell 308, and right portion 304 is used to access memory cell 310. The access line provided by portions 302, 304 is an example of an access line 130 of FIG. 1, or the access line of FIG. 2.

In one embodiment, a split in the access line is provided in a central region 306 of the access line. In one example, the split is formed in the middle of the access line so that portions 302 and 304 are patterned to have substantially equal or identical lengths. In one example, portions 302 and 304 are patterned to have different lengths.

Left and right portions 302, 304 are electrically connected to via 312 by a resistive film 318. Resistive film 318 has a section 320 located between left portion 302 of the access line and via 312. Resistive film 318 has a section 322 located between right portion 304 of the access line and via 312.

In one example, each of sections 320, 322 has a thickness of 1 to 20 nanometers. In one example, each of sections 320, 322, has a width of 10 to 200 nanometers. The width is indicated in FIG. 3 by the arrows corresponding to reference numbers 320, 322.

In one example, resistive film 318 includes tungsten silicon nitride. In one example, resistive film 318 includes one or more of tungsten silicon nitride, titanium silicide nitride, tungsten nitride, titanium nitride, tungsten silicide, or cobalt silicide. The proportions of the foregoing materials can be varied for different memory arrays.

In one embodiment, the split is a gap that physically separates portions 302, 304. In one example, the split includes a non-conductive material formed in central region 306 between portions 302 and 304. In one example, the non-conductive material is an insulating oxide. In one example, the split is an unfilled space between portions 302, 304.

Via 312 is electrically connected to transistor circuitry 316, which is formed in a semiconductor substrate 314. In one example, transistor circuitry 316 includes bias circuitry 124. In one example, transistor circuitry 316 includes one or more voltage drivers to generate voltages on portions 302, 304 of the access line shown in FIG. 3. In one example, transistor circuitry 316 is formed using CMOS transistors.

Figure 4:
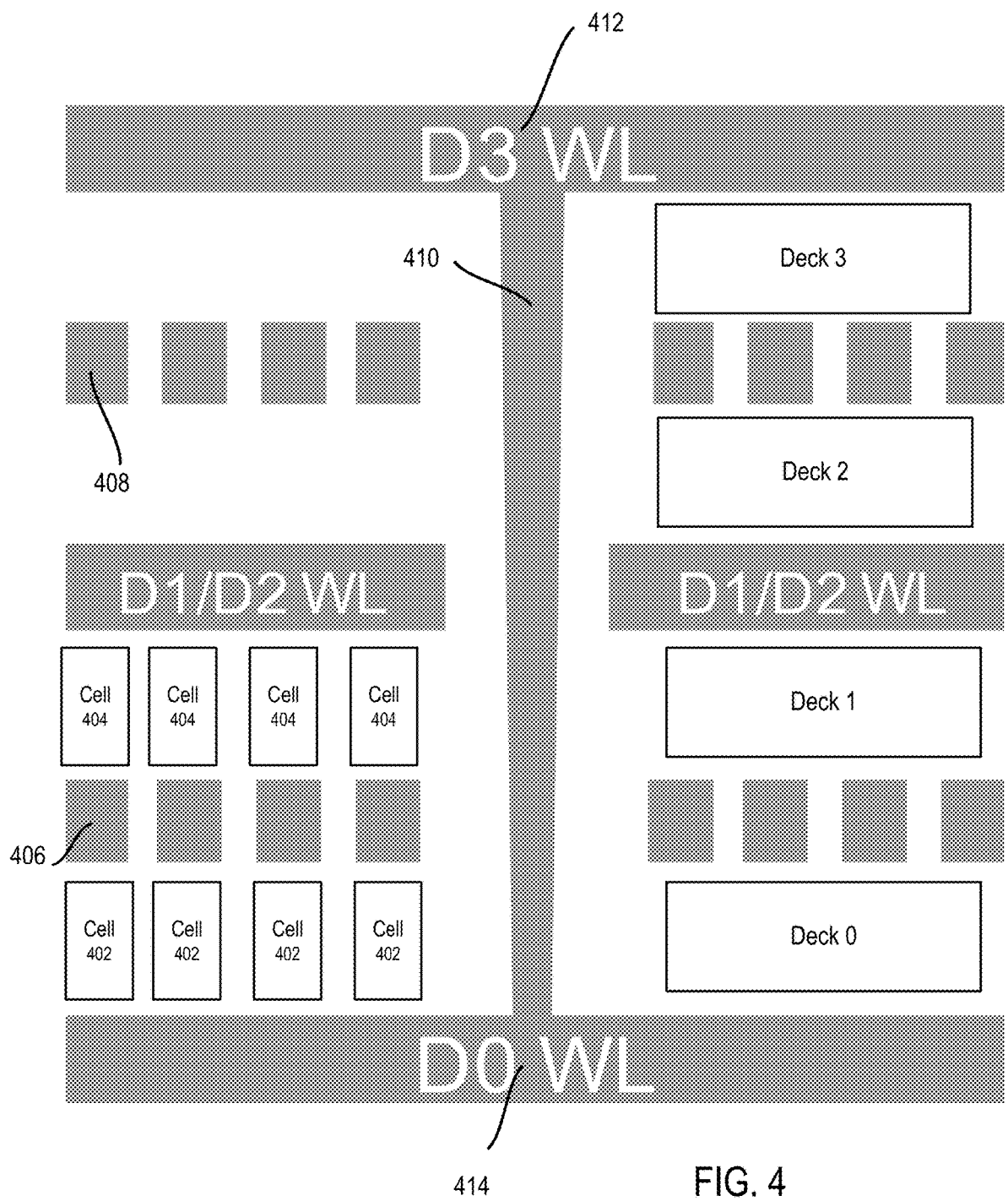
FIG. 4 shows a memory array in a cross-point architecture including various word line and bit line layers that provide access to memory cells arranged in multiple stacked decks, in accordance with some embodiments.

FIG. 4 shows a memory array in a cross-point architecture including various word line and bit line layers that provide access to memory cells arranged in multiple stacked decks, in accordance with some embodiments. The memory array includes various word lines and bit lines arranged orthogonally (e.g., perpendicularly) to one another. For example, word lines 412, 414 are arranged perpendicularly to bit lines 406, 408. Word lines 412, 414 are an example of access lines 130 of FIG. 1. Additionally and/or alternatively, bit lines 406, 408 are an example of access lines 130.

The memory array includes various memory cells arranged in various decks (e.g., Decks 0-3). Each deck includes memory cells. For example, Deck 0 includes memory cells 402, and Deck 1 includes memory cells 404. Memory cells 402, 404 are an example of memory cells 110. In one embodiment, each bit line 406 provides access to memory cells 402, 404, which are located above and below the respective bit line.

Although not shown for purposes of simplified illustration, each of word lines 412, 414 may incorporate resistors 210, 212 described above. In one example, each of word lines 412, 414 is split to have a left portion 302 and a right portion 304, similarly as discussed above. In one example, each word line and/or bit line for any or all of the Decks 0-3 can include a split, such as discussed above for FIG. 3. In one example, various configurations of resistors 210, 212 can be used for different word lines and/or bit lines. In one example, the configuration for resistors 210, 212 is determined based on an extent of electrical discharge associated with a given region of the memory array.

In one embodiment, word line 412 is electrically connected to word line 414 by via 410. Via 410 is an example of via 134, 214, 312.

Although not shown for purposes of simplified illustration, via 410 is electrically connected to a driver used to generate a voltage on word lines 412, 414. In one example, the driver is bias circuitry 124 or driver 216.

Figure 5:
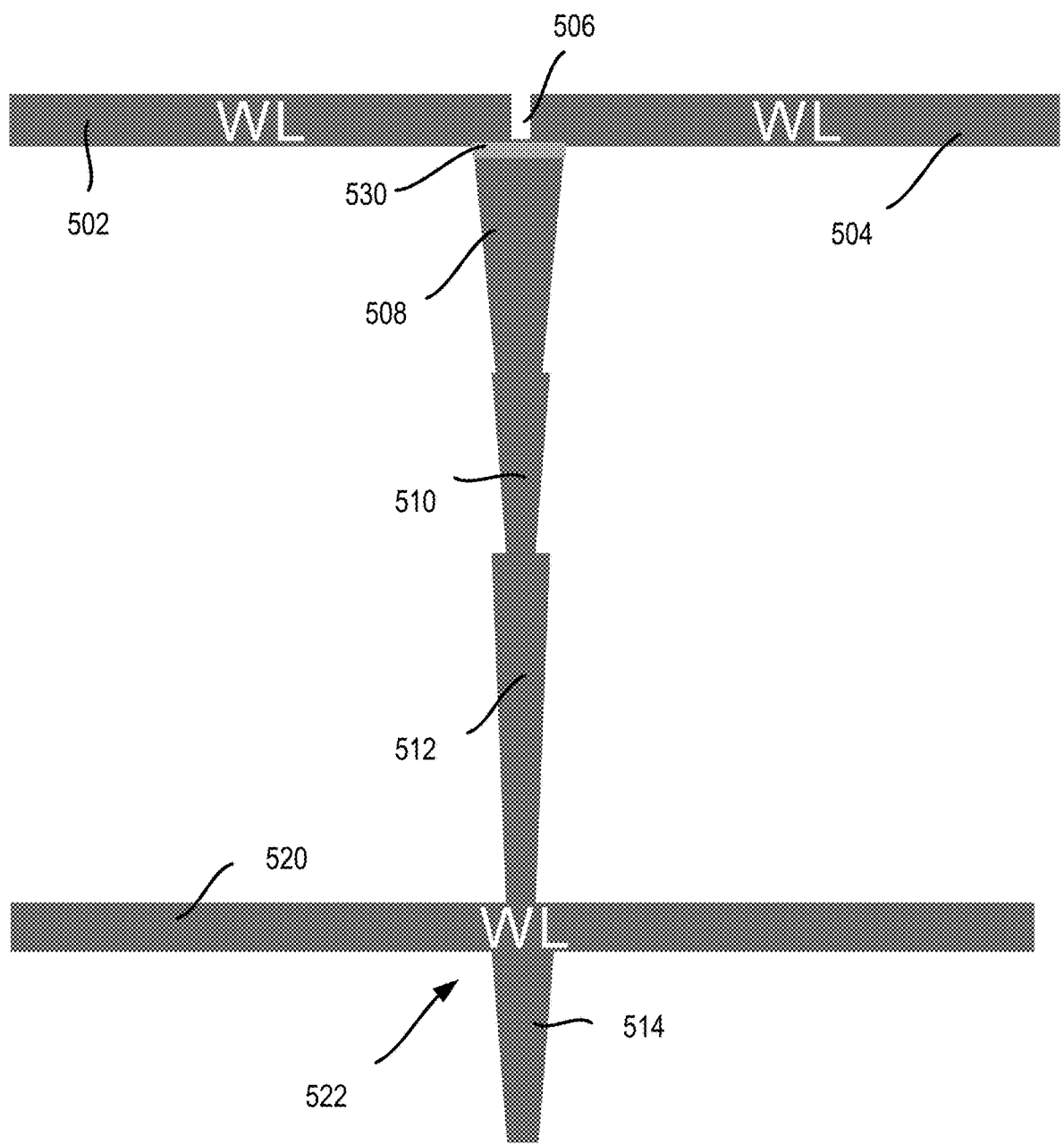
FIG. 5 shows word lines in a memory array electrically connected by a via, in accordance with some embodiments.

FIG. 5 shows word lines in a memory array electrically connected by a via, in accordance with some embodiments. In one embodiment, a word line that provides access to memory cells in a top deck of the memory array has left and right portions 502, 504, which are separated by a split 506. Left and right portions 502, 504 are an example of left and right portions 302, 304. Word line 520 provides access to memory cells in a bottom deck of the memory array.

In one embodiment, a via electrically connects left and right portions 502, 504 to word line 520. In one example, the via includes conductive portions 508, 510, 512, which are electrically connected by via 514 to a driver (not shown). In one example, each of conductive portions 508, 510, 512 corresponds to a conductive layer that is patterned and formed using, for example, a photoresist layer when manufacturing the memory array. In one example, conductive portion 510 is a landing pad for conductive portion 508.

In one embodiment, resistive film 530 electrically connects left and right portions 502, 504 to conductive portion 508. Resistive film 530 is an example of resistive film 318.

In one embodiment, a split (not shown) may be formed above via 514 in central region 522 of word line 520. Word line 520 is an example of word line 414.

Figure 6:
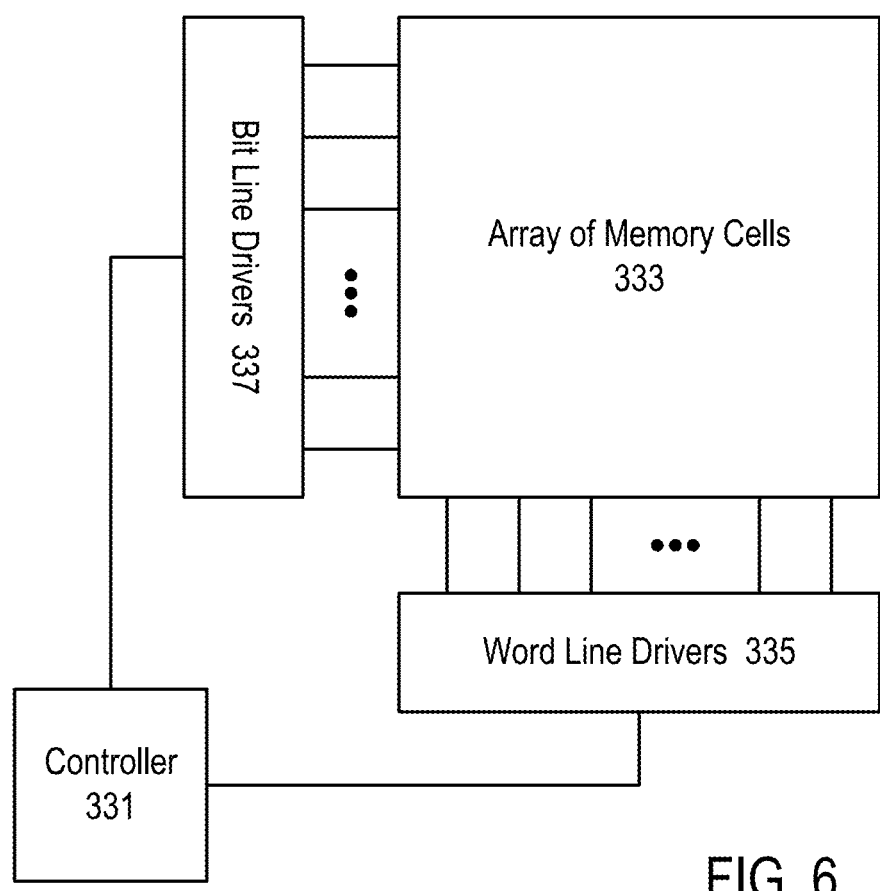
FIG. 6 shows a memory device configured with drivers to generate voltages on access lines of a memory array, in accordance with some embodiments.

FIG. 6 shows a memory device configured with drivers to generate voltages on access lines of a memory array 333, in accordance with some embodiments. For example, memory cells 206, 208 illustrated in FIG. 2 can be used in the memory cell array 333.

The memory device of FIG. 6 includes a controller 331 that operates bit line drivers 337 and word line drivers 335 to access the individual memory cells (e.g., 206, 208) in the array 333. Controller 331 is an example of memory controller 120. Memory array 333 is an example of memory array 102.

The bit line drivers 337 and/or the word line drivers 335 can be implemented by bias circuitry 124. In one example, each memory cell (e.g., 206, 208) in the array 333 can be accessed via voltages driven by a pair of a bit line driver and a word line driver, as illustrated in FIG. 7.

Figure 7:
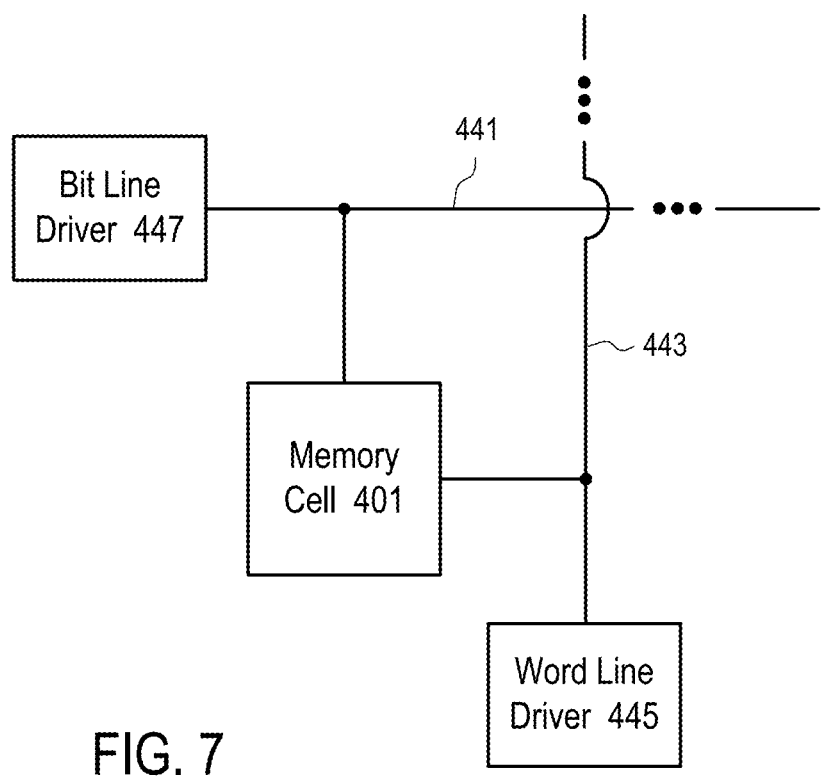
FIG. 7 shows a memory cell with a bit line driver to generate a voltage on a bit line, and a word line driver to generate a voltage on a word line, in accordance with some embodiments.

FIG. 7 shows a memory cell 401 with a bit line driver 447 to generate a voltage on a bit line (wire 441), and a word line driver 445 to generate a voltage on a word line (wire 443), in accordance with some embodiments. For example, the bit line driver 447 drives a first voltage applied to a row of memory cells in the array 333; and the word line driver 445 drives a second voltage applied to a column of memory cells in the array 333. A memory cell 401 in the row and column of the memory cell array 333 is subjected to the voltage difference between the first voltage driven by the bit line driver 447 and the second voltage driven by the word line driver 445. When the first voltage is higher than the second voltage, the memory cell 401 is subjected to one voltage polarity (e.g., positive polarity); and when the first voltage is lower than the second voltage, the memory cell 401 is subjected to an opposite voltage polarity (e.g., negative polarity).

For example, when the memory cell 401 is configured to be read with positive voltage polarity, the bit line driver 447 can be configured to drive a positive voltage. For example, when the memory cell 401 is configured to be read with negative voltage polarity, the word line driver 445 can be configured to drive a positive voltage.

For example, during the write operation, both the bit line driver 447 and the word line driver 445 can drive voltages of differing magnitudes (e.g., to perform read or write steps).

For example, the bit line driver 447 can be configured to drive a positive voltage with differing magnitudes; and the word line driver 445 can be configured to drive a negative voltage with differing magnitudes. The difference between the voltage driven by the bit line driver 447 and the voltage driven the word line driver 445 corresponds to the voltage applied on the memory cell 401.

In one example, the bit line drivers 337 can be used to drive parallel wires (e.g., 441) arranged in one direction and disposed in one layer of cross-point memory; and the word line drivers 435 can be used to drive parallel wires (e.g., 443) arranged in another direction and disposed in another layer of a cross-point memory. The wires (e.g., 441) connected to the bit line drivers (e.g., 447) and the wires (e.g., 443) connected to the word line drivers (e.g., 445) run in the two layers in orthogonal directions. The memory cell array 333 is sandwiched between the two layers of wires; and a memory cell (e.g., 401) in the array 333 is formed at a cross point of the two wires (e.g., 441 and 443) in the integrated circuit die of the cross-point memory.

Figure 8:
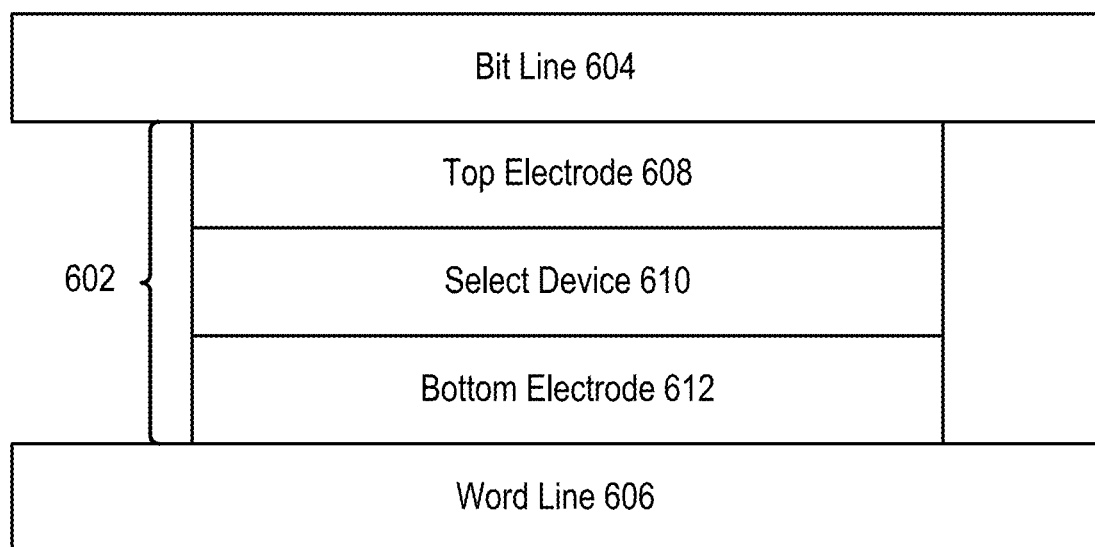
FIG. 8 shows an example of a memory cell that includes a select device, in accordance with some embodiments.

FIG. 8 shows an example of a memory cell that includes a select device 610, in accordance with some embodiments. In one example, select device 610 includes a chalcogenide. Memory cell 602 is an example of memory cells 110, 112; or memory cells 206, 208.

Top electrode 608 conductively connects select device 610 to bit line 604, and bottom electrode 612 conductively connects select device 610 to word line 606. In one example, electrodes 608, 612 are formed of a carbon material. Bit line 604 and word line 606 are each an example of an access line 130. In one example, word line 606 and/or bit line 604 is split into left and right portions 302, 304 as described herein.

In one example, select device 610 includes a chalcogenide (e.g., chalcogenide material and/or chalcogenide alloy). Threshold voltage properties of the select device may be based on the voltage polarities applied to the memory cell.

In one example, a logic state may be written to memory cell 602, which may correspond to one or more bits of data. A logic state may be written to the memory cell by applying voltages of different polarities at different voltage and/or current magnitudes. The memory cell may be read by applying voltages of a single polarity. The writing and reading protocols may take advantage of different threshold voltages of the select device that result from the different polarities. The chalcogenide material of the select device may or may not undergo a phase change during reading and/or writing. In some cases, the chalcogenide material may not be a phase change material.

In one embodiment, an apparatus includes: a memory array (e.g., 102, 333) including an access line (e.g., 130) configured to access memory cells (e.g., 206, 208; 308, 310) of the memory array, the access line having a first portion (e.g., 202, 302) and a second portion (e.g., 204, 304) on opposite sides of a central region (e.g., 306) of the access line, where the first portion is configured to access a first memory cell, and the second portion configured to access a second memory cell; at least one via (e.g., 214, 312) electrically connected at the central region to the first portion and the second portion; a first resistor (e.g., 210) located between the first portion and the via, where the first resistor is configured to screen electrical discharge from the first portion when accessing the second memory cell; a second resistor (e.g., 212) located between the second portion and the via, where the second resistor is configured to screen electrical discharge from the second portion when accessing the first memory cell; and a driver (e.g., 216) electrically connected to the via, where the driver is configured to generate a voltage on the first portion to access the first memory cell, and to generate a voltage on the second portion to access the second memory cell.

In one embodiment, the at least one via is a single via; the access line is a bit line or a word line; and the driver is a bit line driver or a word line driver.

In one embodiment, the first resistor is provided by a first section (e.g., 320) of a resistive film (e.g., 318) overlying the via; and the second resistor is provided by a second section (e.g., 322) of the resistive film overlying the via. The central region includes a split in the access line overlying the via and between the first and second portions of the access line.

In one embodiment, the resistive film includes tungsten silicon nitride.

In one embodiment, the split is formed by removing a third portion of the access line to physically separate the first portion from the second portion; and prior to removing the third portion, the third portion is located between the first portion and the second portion.

In one embodiment, the split includes: a non-conductive material configured to inhibit current discharge from flowing directly between the first and second portions of the access line; or an unfilled space between the first portion and the second portion.

In one embodiment, the memory array is part of a memory device (e.g., 101); the access line is associated with a physical address within the memory array; and an access operation by a controller (e.g., 120) of the memory device to select the first memory cell addresses both the first and second portions of the access line.

In one embodiment, an apparatus includes: an access line having a first portion (e.g., 302) and a second portion (e.g., 304), where the first portion is configured to access a memory cell (e.g., 308) of a memory array, and a gap physically separates the first portion and the second portion; a via (e.g., 312) electrically connected to the first portion and the second portion; and a resistive film (e.g., 318) having a first section between the first portion and the via, and a second section between the second portion and the via.

In one embodiment, the apparatus further includes a driver (e.g., a driver in transistor circuitry 316) electrically connected to the via, where the driver is configured to generate a voltage on the first portion to access the memory cell.

In one embodiment, the gap is a split in the access line formed by removing a third portion of the access line to physically separate the first portion of the access line from the second portion.

In one embodiment, a material forming the resistive film has a higher resistivity than a material forming the first and second portions of the access line.

In one embodiment, the resistive film includes at least one of: tungsten silicon nitride; titanium silicide nitride; tungsten nitride; titanium nitride; tungsten silicide; or cobalt silicide.

In one embodiment, each of the first and second portions is configured to access memory cells located above and below the respective portion.

In one embodiment, the memory array has a cross-point architecture, and the memory cell is: a memory cell including chalcogenide; a memory cell including a select device, and a phase change material as a memory element; a self-selecting memory cell including chalcogenide (e.g., memory cell 602); or a resistive memory cell.

In one embodiment, the gap overlies a third section of the resistive film (e.g., the middle section of resistive film 318 located under central region 306), and the third section is positioned between the first section and the second section.

FIGS. 9-12 show various steps in the manufacture of a memory device that implements spike current suppression, in accordance with some embodiments. In one example, the memory device is memory device 101.

Figure 9:
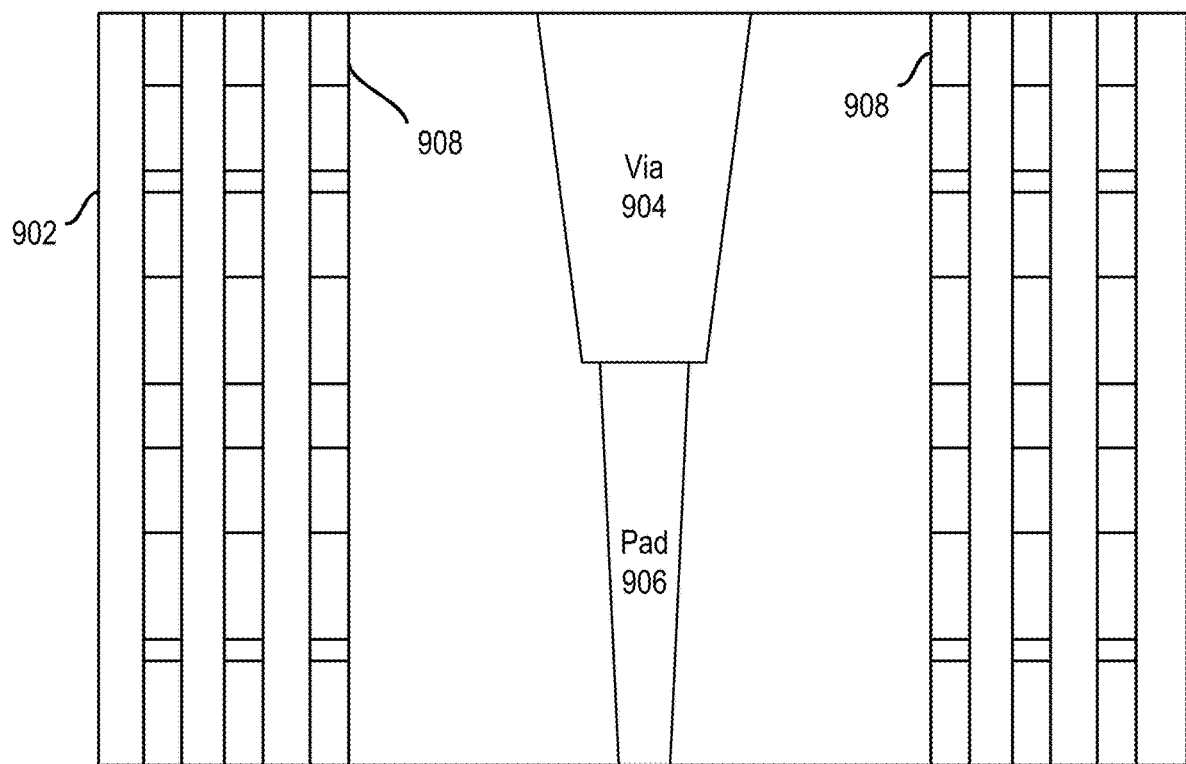
FIGS. 9-12 show various steps in the manufacture of a memory device that implements spike current suppression, in accordance with some embodiments.

FIG. 9 shows a memory array 902 at an intermediate stage of manufacture. Memory array 902 includes various memory cells 908. Each memory cell 908 includes a memory stack containing various layers of materials (e.g., chalcogenide, phase change material, etc.) corresponding to the memory cell technology that has been chosen for use. Memory cells 908 are an example of memory cells 110, 112; memory cells 206, 208; or memory cells 308, 310.

Memory array 902 includes a via 904 that has been formed on a pad 906. Memory array 902 as shown in FIG. 9 can be formed using conventional manufacturing techniques.

Figure 10:
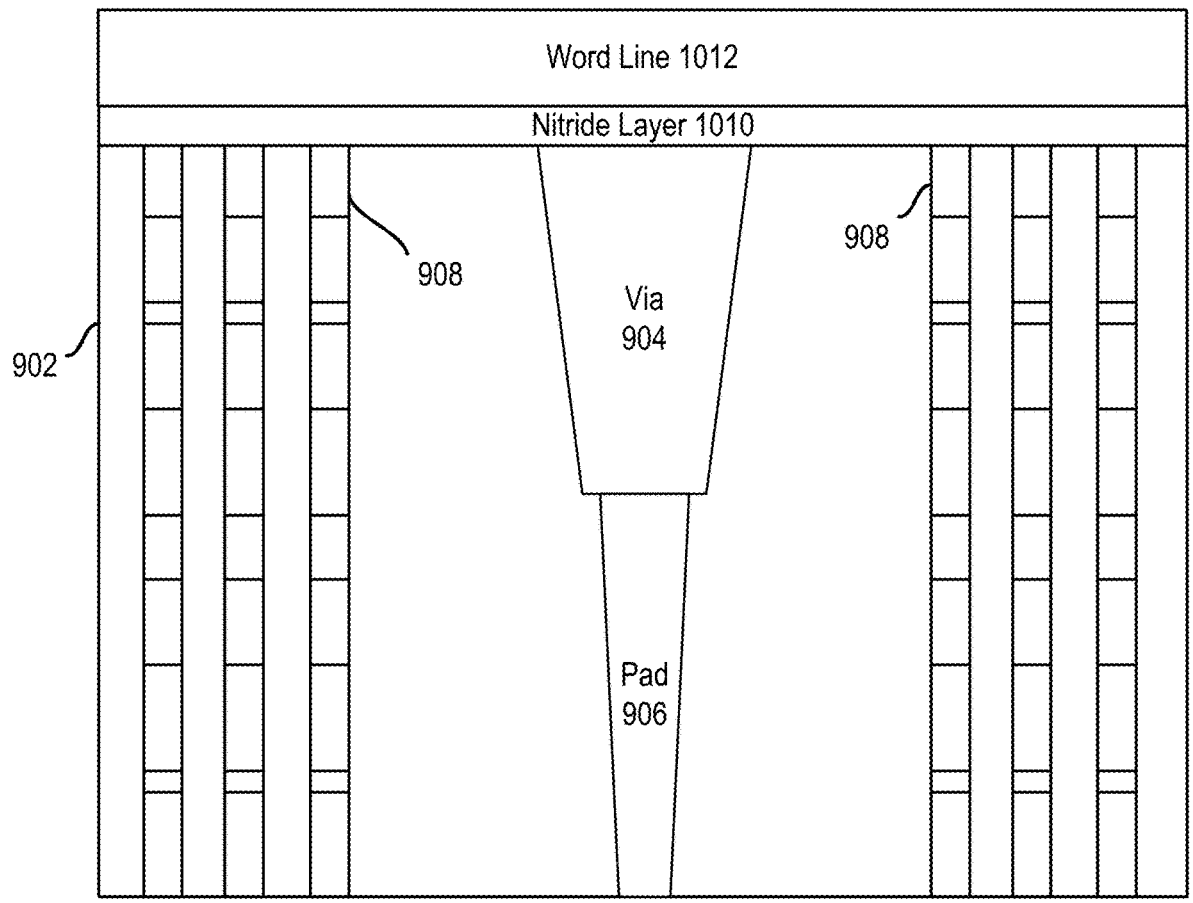

As shown in FIG. 10, a nitride layer 1010 is formed overlying a top surface of memory array 902. In one example, nitride layer 1010 includes one or more of tungsten silicon nitride, titanium silicide nitride, tungsten nitride, or titanium nitride. In one example, one or more of tungsten silicide or cobalt silicide can be alternatively or additionally used. The proportions of the foregoing materials can be varied for different memory arrays.

A word line 1012 is formed overlying nitride layer 1010. In one example, word line 1012 is a conductive material. In one example, word line 1012 is tungsten.

Figure 11:
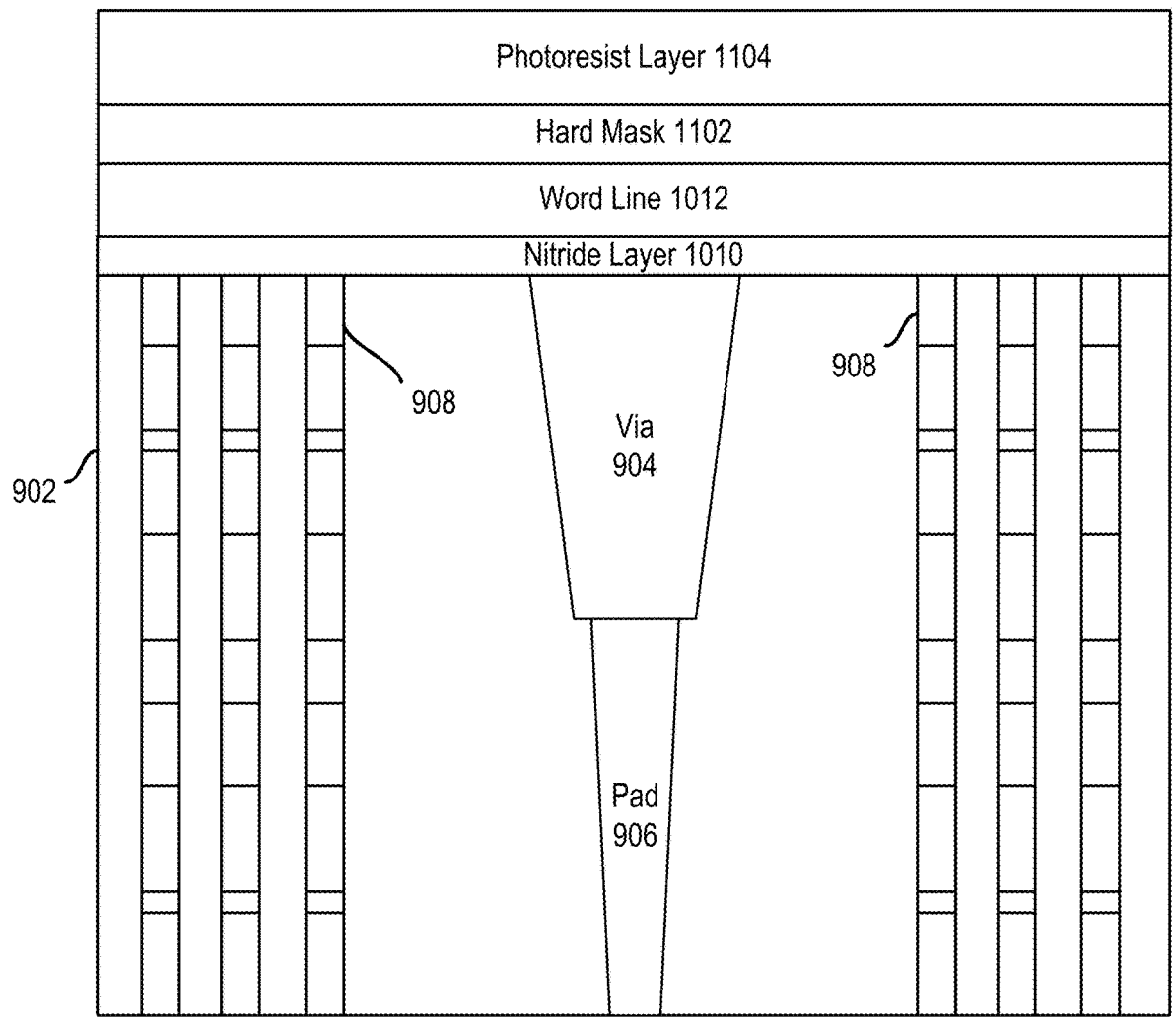

As shown in FIG. 11, a hard mask 1102 is formed overlying word line 1012. Then, a photoresist layer 1104 is formed overlying hard mask 1102.

Figure 12:
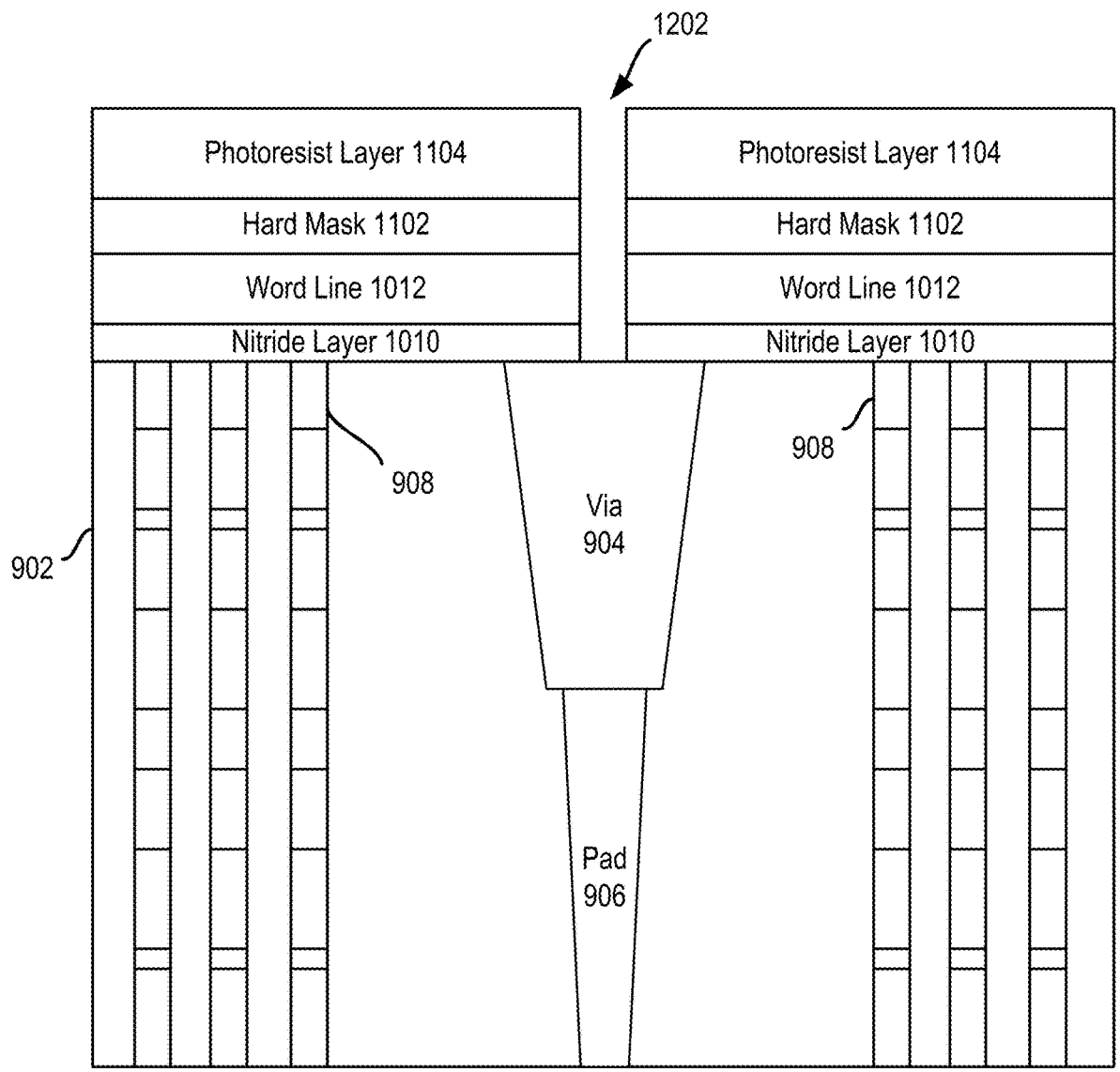

As shown in FIG. 12, photoresist layer 1104 is patterned and used to etch hard mask 1102, word line 1012, and nitride layer 1010 to provide opening 1202 overlying via 904. In one example, a tungsten-only etch is used.

After the above etch, photoresist layer 1104 and hard mask 1102 are removed. Subsequent manufacture of the memory device can be performed using conventional manufacturing techniques.

Providing the opening 1202 splits word line 1012 into left and right portions. In one example, these portions correspond to left and right portions 302, 304.

In one example, the remaining portion of nitride layer 1010 overlying via 904 provides resistive film 318. In an alternative approach, nitride layer 1010 is not etched, so that it fully covers via 904 (e.g., similarly as shown in FIG. 3).

In one embodiment, the memory devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

In one embodiment, a transistor discussed herein (e.g., transistor of transistor circuitry 316) may represent a field-effect transistor (FET) and comprise a three terminal device including a source, drain, and gate. The terminals may be connected to other electronic elements through conductive materials (e.g., metals). In one example, each transistor is used in CMOS transistor circuitry formed at the top surface of a semiconductor wafer and underneath a memory array having multiple decks of memory cells. The source and drain may be conductive and may comprise a heavily-doped (e.g., degenerate) semiconductor region. The source and drain may be separated by a lightly-doped semiconductor region or channel. If the channel is n-type, then the FET may be referred to as a n-type FET. If the channel is p-type, then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be on or activated when a voltage greater than or equal to the transistor's threshold voltage is applied to the transistor gate. The transistor may be off or deactivated when a voltage less than the transistor's threshold voltage is applied to the transistor gate.

Figure 13:
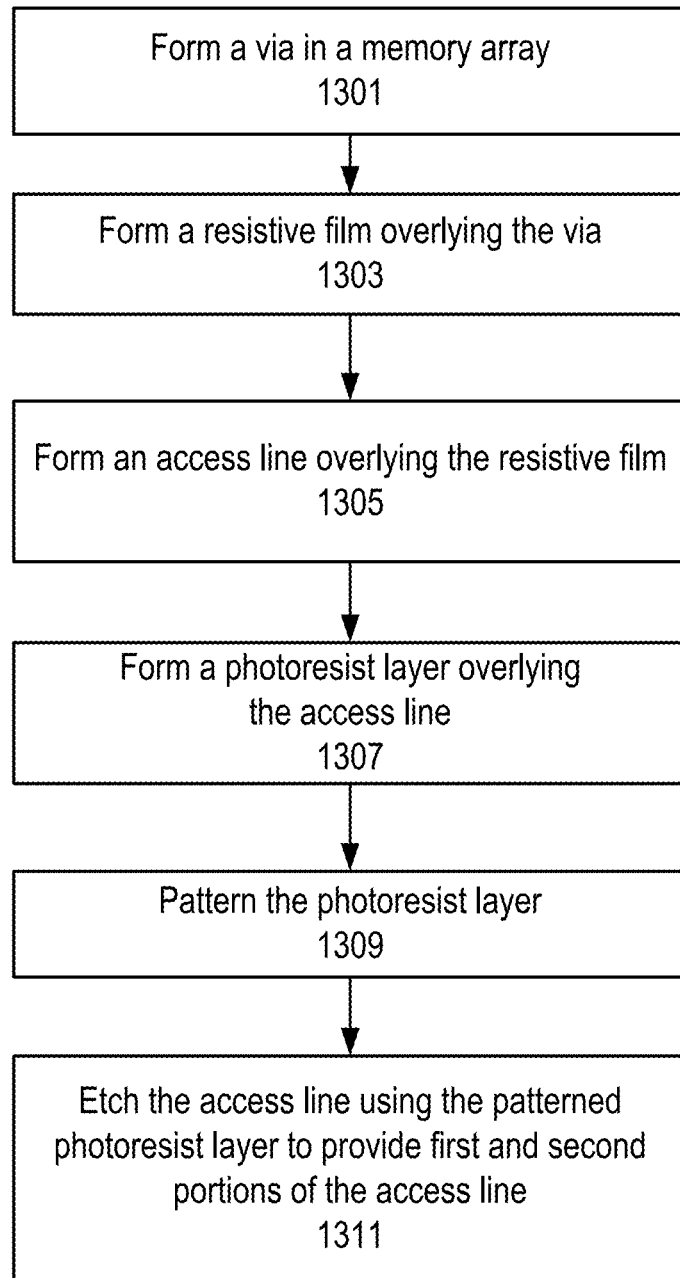
FIG. 13 shows a method for manufacturing a memory device that implements spike current suppression, in accordance with some embodiments.

FIG. 13 shows a method for manufacturing a memory device that implements spike current suppression, in accordance with some embodiments. For example, the method of FIG. 13 can be used to form the split access line and resistive film of FIG. 3. In one example, the manufactured memory device is memory device 101.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1301, a via is formed in a memory array. In one example, the via is via 904. In one example, the memory array is memory array 902.

At block 1303, a resistive film is formed overlying the via. In one example, the resistive film is nitride layer 1010.

At block 1305, an access line is formed overlying the resistive film. In one example, the access line is word line 1012.

At block 1307, a photoresist layer is formed overlying the access line. In one example, the photoresist layer is photoresist layer 1104. In one example, the photoresist layer is formed overlying a hard mask (e.g., hard mask 1102).

At block 1309, the photoresist layer is patterned. In one example, the photoresist layer is patterned to use in etching that provides opening 1202.

At block 1311, the access line is etched using the patterned photoresist layer to provide first and second portions of the access line. In one example, the access line is etched to split the access line into left and right portions 302, 304.

In one embodiment, a method includes: forming a via (e.g., via 312); forming a resistive film (e.g., 318) overlying the via; forming an access line (e.g., an access line that provides left and right portions 302, 304) overlying the resistive film; and patterning the access line to provide first and second portions. The patterning physically separates the first portion from the second portion (e.g., the patterning provides a split in the access line), and the first portion is configured to access a memory cell (e.g., 308) of a memory array. A first section of the resistive film is between the first portion and the via, and a second section of the resistive film is between the second portion and the via.

In one embodiment, patterning the access line includes: forming a photoresist layer overlying the access line; patterning the photoresist layer; and performing an etch using the patterned photoresist layer to etch the access line. Performing the etch includes etching the access line to provide a split overlying the via and between the first and second portions (e.g., a split located in central region 306 and overlying via 312).

In one embodiment, performing the etch further includes etching the resistive film to physically separate the first and second sections.

In one embodiment, the first and second sections of the resistive film each have a thickness of 1 to 20 nanometers; the first section has a width of 10 to 200 nanometers; and the second section has a width of 10 to 200 nanometers.

In one embodiment, the memory array is part of a memory device (e.g., 101). The method further includes forming a transistor circuit (e.g., transistor circuitry 316) located under the memory array and electrically connected to the via. The transistor circuit is configured to generate a voltage on the first portion to access the memory cell during a read or write operation, and the voltage is generated in response to a command received from a host device (e.g., 126) by a controller (e.g., 120) of the memory device.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations of a memory device may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Functions can be implemented using hardwired circuitry without software instructions, or in combination with software instructions. Thus, the techniques are not limited to any specific combination of hardware circuitry and software, nor to any particular source for the instructions executed by a computing device.

The memory device as described above can include one or more processing devices (e.g., processing device 116), such as a microprocessor, executing sequences of instructions contained in a memory, such as ROM, volatile RAM, non-volatile memory, cache or a remote storage device.

Routines executed to implement memory operations may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods for a memory device (e.g., read or write operations). The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement various functions of a memory device. Thus, the techniques are neither limited to any specific combination of hardware circuitry and software nor to any particular source for the instructions executed by a computing device.

Various embodiments set forth herein can be implemented for memory devices that are used in a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system (e.g., memory device 101) so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
a memory array comprising an access line configured to access memory cells of the memory array, the access line having a first portion and a second portion on opposite sides of a central region of the access line, wherein the first portion is configured to access a first memory cell, and the second portion is configured to access a second memory cell;
at least one via electrically connected at the central region to the first portion and the second portion;
a first resistor located between the first portion and the via, wherein the first resistor is configured to screen electrical discharge from the first portion when accessing the second memory cell;
a second resistor located between the second portion and the via, wherein the second resistor is configured to screen electrical discharge from the second portion when accessing the first memory cell; and
a driver electrically connected to the via, wherein the driver is configured to generate a voltage on the first portion to access the first memory cell, and to generate a voltage on the second portion to access the second memory cell.

2. The apparatus of claim 1, wherein:
the at least one via is a single via;
the access line is a bit line or a word line; and
the driver is a bit line driver or a word line driver.

3. The apparatus of claim 1, wherein:
the first resistor is provided by a first section of a resistive film overlying the via; and
the second resistor is provided by a second section of the resistive film overlying the via;
wherein the central region includes a split in the access line overlying the via and between the first and second portions of the access line.

4. The apparatus of claim 1, wherein the resistive film comprises tungsten silicon nitride.

5. The apparatus of claim 1, wherein:
the split is formed by removing a third portion of the access line to physically separate the first portion from the second portion; and
prior to removing the third portion, the third portion is located between the first portion and the second portion.

6. The apparatus of claim 5, wherein the split includes:
a non-conductive material configured to inhibit current discharge from flowing directly between the first and second portions of the access line; or
an unfilled space between the first portion and the second portion.

7. The apparatus of claim 1, wherein:
the memory array is part of a memory device;
the access line is associated with a physical address within the memory array; and
an access operation by a controller of the memory device to select the first memory cell addresses both the first and second portions of the access line.

8. An apparatus, comprising:
an access line having a first portion and a second portion, wherein the first portion is configured to access a memory cell of a memory array, and a gap physically separates the first portion and the second portion;
a via electrically connected to the first portion and the second portion; and
a resistive film having a first section between the first portion and the via, and a second section between the second portion and the via.

9. The apparatus of claim 8, further comprising a driver electrically connected to the via, wherein the driver is configured to generate a voltage on the first portion to access the memory cell.

10. The apparatus of claim 8, wherein the gap is a split in the access line formed by removing a third portion of the access line to physically separate the first portion of the access line from the second portion.

11. The apparatus of claim 8, wherein a material forming the resistive film has a higher resistivity than a material forming the first and second portions of the access line.

12. The apparatus of claim 8, wherein the resistive film comprises at least one of:
    tungsten silicon nitride;
    titanium silicide nitride;
    tungsten nitride;
    titanium nitride;
    tungsten silicide; or
    cobalt silicide.

13. The apparatus of claim 8, wherein each of the first and second portions is configured to access memory cells located above and below the respective portion.

14. The apparatus of claim 8, wherein the memory array has a cross-point architecture, and the memory cell is:
    a memory cell comprising chalcogenide;
    a memory cell comprising a select device, and a phase change material as a memory element;
    a self-selecting memory cell comprising chalcogenide; or
    a resistive memory cell.

15. The apparatus of claim 8, wherein the gap overlies a third section of the resistive film, and the third section is positioned between the first section and the second section.

16. A method comprising:
    forming a via;
    forming a resistive film overlying the via;
    forming an access line overlying the resistive film; and
    patterning the access line to provide first and second portions, wherein the patterning physically separates the first portion from the second portion, and wherein the first portion is configured to access a memory cell of a memory array;
    wherein a first section of the resistive film is between the first portion and the via, and a second section of the resistive film is between the second portion and the via.

17. The method of claim 16, wherein patterning the access line comprises:
    forming a photoresist layer overlying the access line;
    patterning the photoresist layer; and
    performing an etch using the patterned photoresist layer to etch the access line, wherein performing the etch includes etching the access line to provide a split overlying the via and between the first and second portions.

18. The method of claim 17, wherein performing the etch further includes etching the resistive film to physically separate the first and second sections.

19. The method of claim 16, wherein:
    the first and second sections of the resistive film each have a thickness of 1 to 20 nanometers;
    the first section has a width of 10 to 200 nanometers; and
    the second section has a width of 10 to 200 nanometers.

20. The method of claim 16, wherein the memory array is part of a memory device, the method further comprising forming a transistor circuit located under the memory array and electrically connected to the via, wherein the transistor circuit is configured to generate a voltage on the first portion to access the memory cell during a read or write operation, and the voltage is generated in response to a command received from a host device by a controller of the memory device.

\* \* \* \* \*